(12) United States Patent
Abe et al.

(10) Patent No.: US 10,283,394 B2
(45) Date of Patent: May 7, 2019

(54) ARTICLE TRANSPORT DEVICE

(71) Applicant: Daifuku Co., Ltd., Osaka-shi (JP)

(72) Inventors: Takeshi Abe, Hinocho (JP); Minehiko Hirate, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/697,782

(22) Filed: Sep. 7, 2017

(65) Prior Publication Data

US 2018/0076059 A1 Mar. 15, 2018

(30) Foreign Application Priority Data

Sep. 9, 2016 (JP) ................. 2016-176972

(51) Int. Cl.
*H01L 21/677* (2006.01)
*B66F 9/06* (2006.01)
*H01L 21/673* (2006.01)

(52) U.S. Cl.
CPC ........... *H01L 21/6773* (2013.01); *B66F 9/06* (2013.01); *H01L 21/67353* (2013.01); *H01L 21/67356* (2013.01); *H01L 21/67379* (2013.01); *H01L 21/67736* (2013.01); *H01L 21/67769* (2013.01); *H01L 21/67775* (2013.01); *B65G 2201/0235* (2013.01); *H01L 21/67712* (2013.01)

(58) Field of Classification Search
CPC ........... H01L 21/6773; H01L 21/67356; H01L 21/67379; H01L 21/67775
USPC ................. 414/267, 277, 280, 281
See application file for complete search history.

(56) References Cited

U.S. PATENT DOCUMENTS

| | | | | |
|---|---|---|---|---|
| 8,550,006 B2 * | 10/2013 | Wada | ................ | H01L 21/67775 104/89 |
| 9,312,158 B2 * | 4/2016 | Wada | ...................... | B66C 13/06 |
| 9,576,832 B2 * | 2/2017 | Tomida | ............... | H01L 21/6773 |
| 9,685,361 B2 * | 6/2017 | Yoshioka | ........... | H01L 21/67769 |
| 9,899,247 B2 * | 2/2018 | Kawamura | ....... | H01L 21/67379 |
| 2003/0077153 A1 * | 4/2003 | Elliott | ............... | H01L 21/67294 414/281 |
| 2004/0047714 A1 * | 3/2004 | Poli | .................... | H01L 21/67769 414/281 |
| 2008/0193270 A1 * | 8/2008 | Yoshida | .................... | B66C 7/02 414/731 |

(Continued)

FOREIGN PATENT DOCUMENTS

JP 6156628 A 6/1994

*Primary Examiner* — Kaitlin S Joerger
(74) *Attorney, Agent, or Firm* — The Webb Law Firm

(57) ABSTRACT

An article transport device includes an article support member for supporting an article having a plate-shaped flange portion in an upper portion thereof, with the article placed on its receiving member. The article support member further includes a restricting member which is positioned such that at least a portion of the restricting member is located across from at least a portion of a front side surface of the flange portion when the article is in the supported state, and which is configured to restrict the article in the supported state from moving at least in the front direction by distances greater than a movement distance specified in advance. The restricting member includes a pair of front restricting portions that are so located to be spaced apart from each other to form a gap, wherein the restricting member and the receiving member are fixedly connected to each other.

16 Claims, 8 Drawing Sheets

(56) References Cited

U.S. PATENT DOCUMENTS

| | | | | |
|---|---|---|---|---|
| 2010/0117391 A1* | 5/2010 | Murata | ............ | H01L 21/67379 |
| | | | | 294/119.1 |
| 2014/0086712 A1* | 3/2014 | Oyama | ............ | H01L 21/67379 |
| | | | | 414/222.01 |
| 2014/0110192 A1* | 4/2014 | Yoshioka | .................. | B66F 9/07 |
| | | | | 182/82 |
| 2017/0194184 A1* | 7/2017 | Tominaga | ............... | A47B 81/00 |
| 2018/0076059 A1* | 3/2018 | Abe | .................... | H01L 21/6773 |
| 2018/0076074 A1* | 3/2018 | Abe | .................. | H01L 21/67393 |

* cited by examiner

ARTICLE TRANSPORT DEVICE

CROSS-REFERENCE TO RELATED APPLICATION

This application claims priority to Japanese Patent Application No. 2016-176972 filed Sep. 9, 2016, the disclosure of which is hereby incorporated in its entirety by reference.

FIELD OF THE INVENTION

The present invention relates to an article transport device configured to transport an article at least in a vertical direction with the article in a supported state in which the article is received and supported by a plate-shaped receiving member whose one horizontal end is fixed.

BACKGROUND ART

A stacker crane (2) for transporting articles (W) by vertically moving a vertically movable carriage (7) along a mast (5) that stands vertically is disclosed in JP Publication of application No. 06-156628. A receiving member (7b) of the vertically movable carriage (7) has a so-called cantilever structure in which its one horizontal end is supported by the mast (5) whereas the other end is left unsupported. Thus, the end portion of the receiving member (7b) that is left unsupported may oscillate vertically, for example, when the vertically movable carriage (7) comes to a sudden stop that results in a large deceleration while transporting an article (W) with the article (W) placed on the receiving member (7b) which in turn results in the vertically movable carriage (7) receiving a large external force. And this oscillation may cause the article (W) placed on the receiving member (7b) to be displaced out of position or to fall out of the receiving member (7b).

For this reason, this stacker crane (2) is provided with a pressing-down plate (15) which restricts upward movement of the article (W) after an article (W) is placed on the receiving member (7b). The pressing-down plate (15) is configured to be moved up and down, and is retrieved upward and away from position when placing an article (W) on the receiving member (7b) and is lowered to cause it to contact an upper portion of the article (W) after the article (W) has been placed on the receiving member (7b). In other words, by holding the article (W) from above and below by, and between, the receiving member (7b) and the pressing-down plate (15), the article (W) placed on the receiving member (7b) is prevented from being displaced out of position or falling out of the receiving member (7b), even when the vertically movable carriage (7) receives a large external force.

However, this vertically movable carriage (7) requires an actuator, such as an electric cylinder (13), and a control circuitry therefor, for vertically moving the pressing-down plate (15). This causes the vertically movable carriage (7) to have a complex structure which tends to cause increase in its size and weight.

SUMMARY OF THE INVENTION

In light of above, technology is desired with which, with a relatively simple structure, an article supported on a receiving member can be prevented from being displaced out of position or from falling out of the receiving member while being transported.

In one embodiment, an article transport device in light of the above comprises: an article support member configured to receive and support an article on a plate-shaped receiving member whose one end along a first direction parallel to a horizontal plane is a fixed end, and whose opposite end along the first direction is an unsupported end, wherein the article transport device is configured to transport the article at least in a vertical direction with the article in a supported state which is a state of the article in which the article is supported by the article support member, wherein, with a second direction being a direction that is parallel to the horizontal plane and that is perpendicular to the first direction, a front and back direction of the article being a direction, of the article in the supported state, that is parallel to the first direction, a lateral width direction of the article being a direction, of the article in the supported state, that is parallel to the second direction, a front direction side of the article along the front and back direction being an unsupported end side of the article in the supported state along the front and back direction, a back direction side of the article along the front and back direction being a fixed-end side of the article in the supported state along the front and back direction, and an up and down direction of the article being a direction, of the article in the supported state, that is parallel to the vertical direction, the article has a plate-shaped flange portion, which extends parallel to the horizontal plane, in an upper portion of the article with respect to the up and down direction, wherein the article support member further includes a restricting member which is positioned such that at least a portion of the restricting member is located across from at least a portion of a front side surface of the flange portion when the article is in the supported state, and which is configured to restrict the article in the supported state from moving at least in the front direction by distances greater than a movement distance specified in advance, wherein the restricting member includes a pair of front restricting portions that are so located to be spaced apart from each other to form a gap therebetween along the second direction, wherein the restricting member and the receiving member are fixedly connected to each other directly or indirectly.

With this arrangement, movement of the article received by (i.e., placed on) the receiving member at least in the front direction is restricted by the pair of front restricting portions. In addition, the fixed end of the receiving member is located on the back side of the article. And a member for fixing the receiving member is often provided on the back side of the article. Thus, movement of the article in the back direction is also restricted by that member. Therefore, by providing the pair of front restricting portions, the article received by, or placed on, the support platform can be prevented from being displaced out of position or from falling off from the unsupported end of the receiving member. In addition, the restricting member having the pair of front restricting portions and the receiving member are fixedly connected to each other directly or indirectly. In other words, the article support member can restrict movement of an article in the front direction without having to move any movable restricting member to a specified position after the article is received by, or placed on, the receiving member. Therefore, the article support member does not require a driving mechanism, or an actuator, etc. for moving any restricting member, preventing the article transport device from becoming more complex or larger in size. As such, with the arrangement describe, with a relatively simple structure, an article received by a receiving member can be prevented from being displaced out of position or from falling out of the receiving member while being transported.

Additional features and advantages of the article transport device will be made apparent from the following description of the embodiments given with reference to the attached drawings.

DETAILED DESCRIPTION OF EMBODIMENTS

Figure 1:
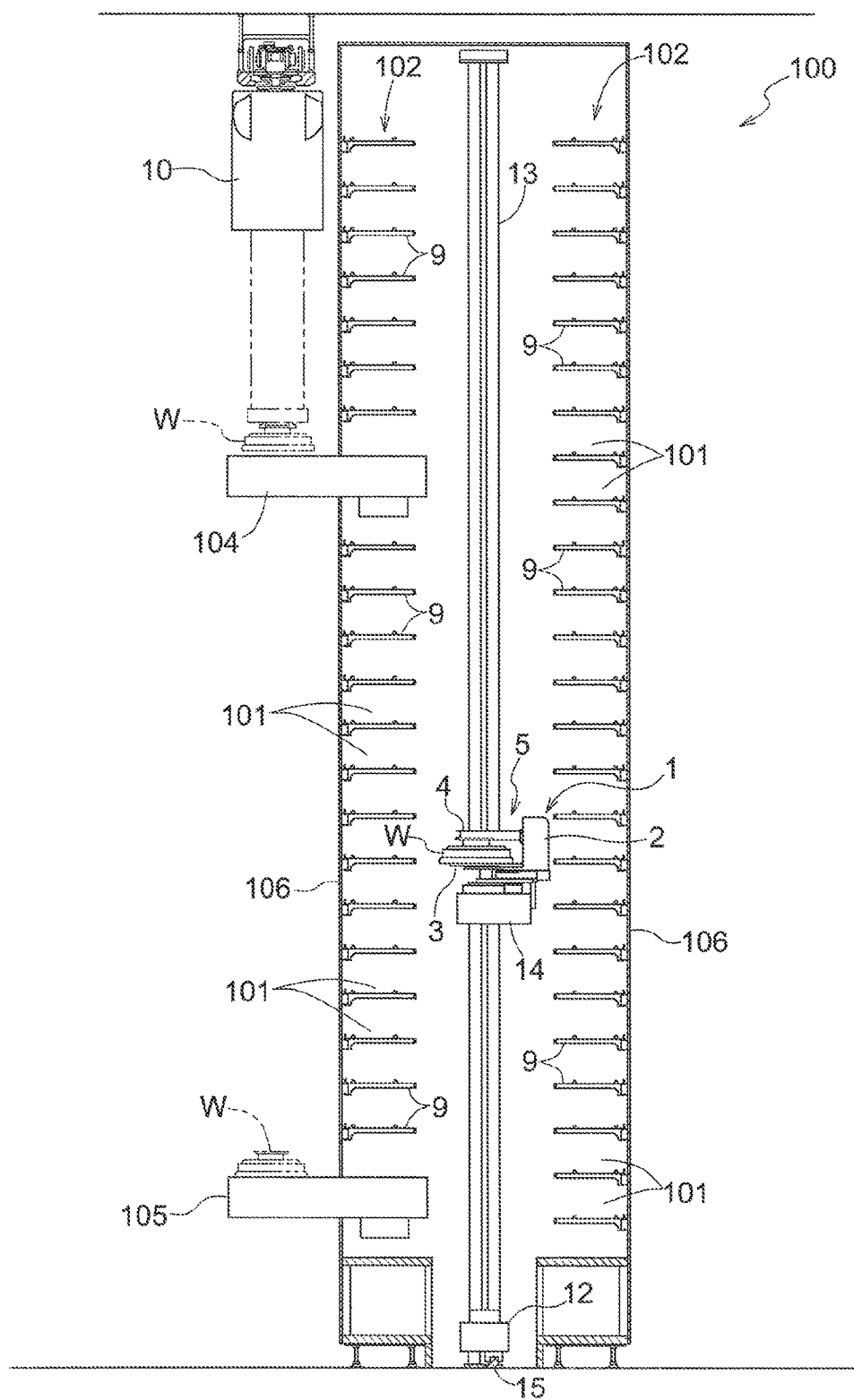
FIG. 1 is a drawing schematically showing a structure of an article storage facility.

Embodiments of an article transport device are described next with reference to the attached drawings. FIG. 1 shows an example of an article storage facility 100 provided with an article transport device. The article storage facility 100 includes article storage racks 102, a stacker crane 1 (article transport device), one or more ceiling or overhead transport vehicle 10, an upper carry-in-and-out conveyor 104, and a lower carry-in-and-out conveyor 105. Each article storage rack 102 has a plurality of storage sections 101 each of which is configured to store a container W as an article. As described below in detail, in the present embodiment, an example is described in which each container W is a reticle pod configured to hold a reticle (photomask).

Each of the stacker crane 1 and the ceiling transport vehicles 10 transports containers W, one container W at a time. The article storage rack 102 and the stacker crane 1 are installed in an installation space surrounded and defined by walls 106. The stacker crane 1 transports containers W in the installation space. Each of the upper carry-in-and-out conveyor 104 and the lower carry-in-and-out conveyor 105 is installed such that it extends through a wall 106 and transports articles W between a location within the installation space and a location outside thereof. Each ceiling transport vehicle 10 transports the container W outside the installation space.

The article storage racks 102 are provided to form a pair and are so disposed that they face each other with a mast 13 (support column) of the stacker crane 1 located therebetween. Each of the pair of article storage racks 102 has a plurality of storage sections 101 arranged one above another along a vertical direction and one next to another along a rack lateral direction (a direction perpendicular to the paper of FIG. 1). Each of the plurality of storage sections 101 includes a shelf board 9 configured to support a container W stored in the storage section 101.

Each of the upper carry-in-and-out conveyor 104 and the lower carry-in-and-out conveyor 105 receives and transports a container W between an external transfer location located outside a wall 106 and an internal transfer location located inside the wall 106. A ceiling transport vehicle 10 loads and unloads a container W from and to the external transfer location of the upper carry-in-and-out conveyor 104 which is installed in a relatively high position whereas a worker loads and unloads a container W from and to the external transfer location of the lower carry-in-and-out conveyor 104 which is installed in a relatively low position.

When a container W is placed on the external transfer location of the upper carry-in-and-out conveyor 104 or the lower carry-in-and-out conveyor 105, the container W is supported and transported from the external transfer location to the internal transfer location by the conveyor. The stacker crane 1 transports the container W from an internal transfer location to a storage section 101, and places the container W on the shelf board 9 (carry-in operation). Conversely, the stacker crane 1 retrieves a container W from the shelf board 9 of a storage section 101 and transports it to the internal transfer location of the upper carry-in-and-out conveyor 104 or the lower carry-in-and-out conveyor 105. The container W is then supported and transported from the internal transfer location to the external transfer location by the conveyor, and is picked up from the external transfer location by a ceiling transport vehicle 10 or a worker (carry-out operation). As such, the stacker crane 1 transports containers W, one container W at a time, between internal transfer locations and the storage sections 101.

Figure 2:
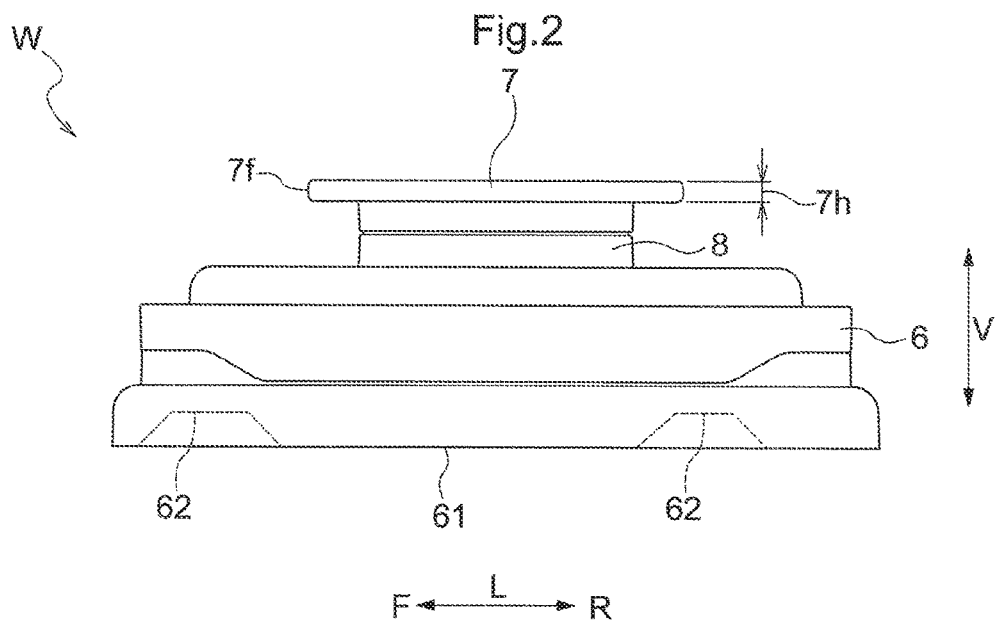
FIG. 2 is a side view of a container.
Figure 3:
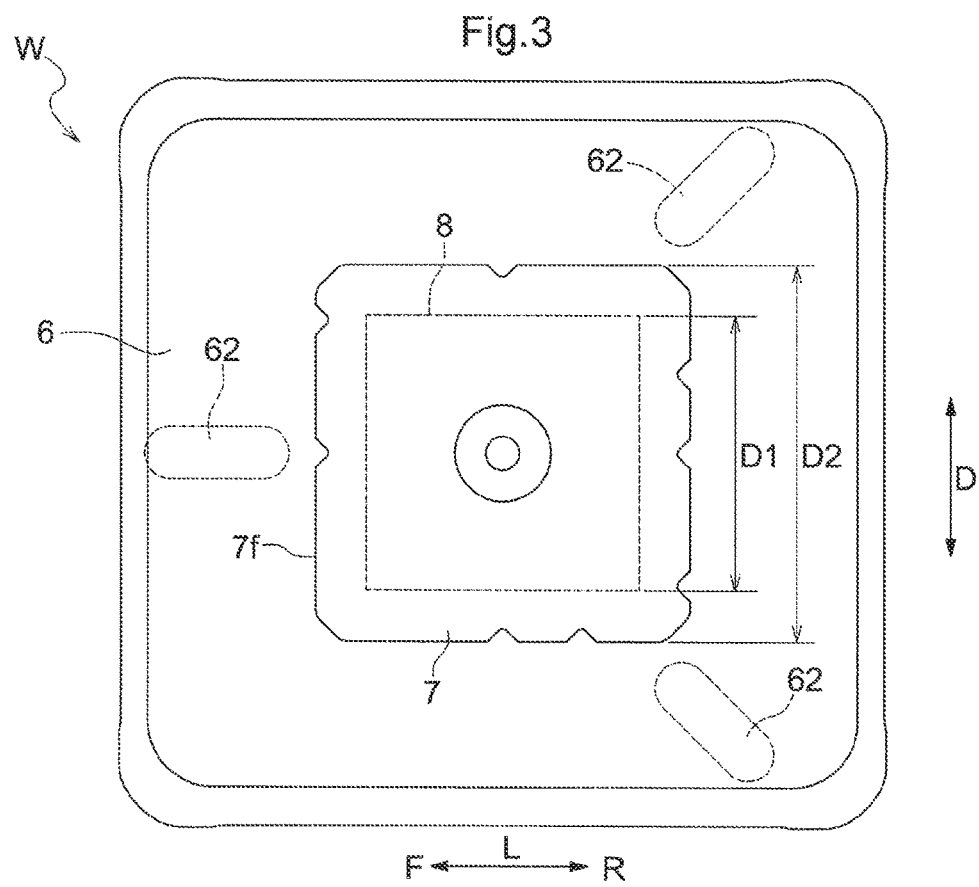
FIG. 3 is a top view of the container.

Each container W is a reticle pod in the present embodiment as described above. As shown in FIGS. 2 and 3, each container W has a container main body 6 for holding a reticle, and a flange portion 7 located above the container main body 6 and provided at an upper end of the container W. In addition, each container W has a flange support member 8 located below the flange portion 7 to fixedly support the flange portion 7. As shown in FIG. 1, the ceiling transport vehicle 10 suspends and supports a container W by holding its flange portion 7 to transport the container W. In addition, the stacker crane 1 transports a container W with the bottom surface 61 of the container main body 6 received (i.e., being placed on) and supported by a receiving member 3.

As shown in FIGS. 2 and 3, bottom surface recessed portions 62, each of which is recessed upwardly along the vertical direction V, are provided at three locations in the bottom surface 61 of the container main body 6 (i.e., the bottom surface 61 of the container W). Each bottom surface recessed portion 62 is formed in a shape that tapers toward its top. And the inner surface of each bottom surface recessed portion 62 includes a sloped surface. As described in detail below, fork-side positioning pins 3*p* provided to the fork 5 (article support member) of the stacker crane 1, and shelf-board-side positioning pins 9*p* provided to the shelf board 9 of each storage section 101 engage these bottom surface recessed portions 62 from below (see FIG. 4 and FIG. 8 etc.). When a container W is placed on a shelf board 9 or picked up by the fork 5, these positioning pins are guided by the inner surfaces of the bottom surface recessed portions 62 even if the position of the container W is displaced horizontally from its proper position. This allows the horizontal position of the container W to be corrected to a proper position with respect to the fork 5 or the shelf board 9.

Figure 4:
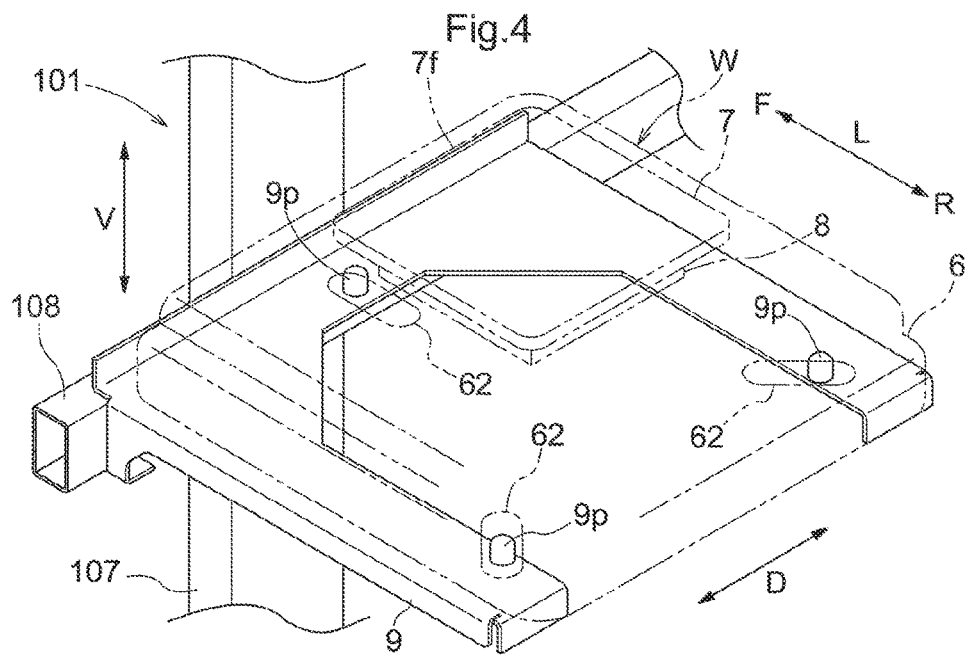
FIG. 4 is a perspective view schematically showing a shelf board of an article storage rack.

FIG. 4 schematically shows a shelf board 9 of an article storage rack 102. Each shelf board 9 is supported in a cantilever fashion in which one end of the shelf board 9 is fixed to a horizontal frame member 108 which in turn is fixed to vertical frame members 107 while the other end of the shelf board 9 is left unsupported. As shown in FIG. 4, each shelf board 9 is generally formed to have a U-shape and not a rectangular shape, and supports three sides of the generally rectangular bottom surface 61 of a container W. A shelf-board-side positioning pin 9*p* is located at each of three locations of the shelf board 9 with one located in a bottom portion of the U-shape and one located in each side portion. As described above, when a container W is placed on a shelf board 9, the three shelf-board-side positioning pins 9*p* engage the respective three bottom surface recessed portions 62 of the container W to have the container W properly placed on the shelf board 9.

As shown in FIG. 1, the stacker crane 1 has a travel carriage 12 configured to travel along a rail 15 installed between the pair of article storage racks 102, a vertically movable member 14 which can be vertically moved along a mast 13 arranged vertically on the travel carriage 12, and a fork 5 which is supported by a vertically movable member 14 and is configured to transfer a container W to and from a storage section 101 or an internal transfer location. The stacker crane 1 is configured to transport a container W to and from an internal transfer location or a storage section 101 as a result of the fact that the travel carriage 12 is moved by a travel actuator not shown, that the vertically movable member 14 is vertically moved by the vertical movement actuator not shown, and that the fork 5 is projected and retracted by a linkage mechanism and a transfer actuator not shown. The each actuator may be an electric motor operatively coupled to the component that is actuated by the actuator through one or more conventional components such as belts or gears.

Figure 5:
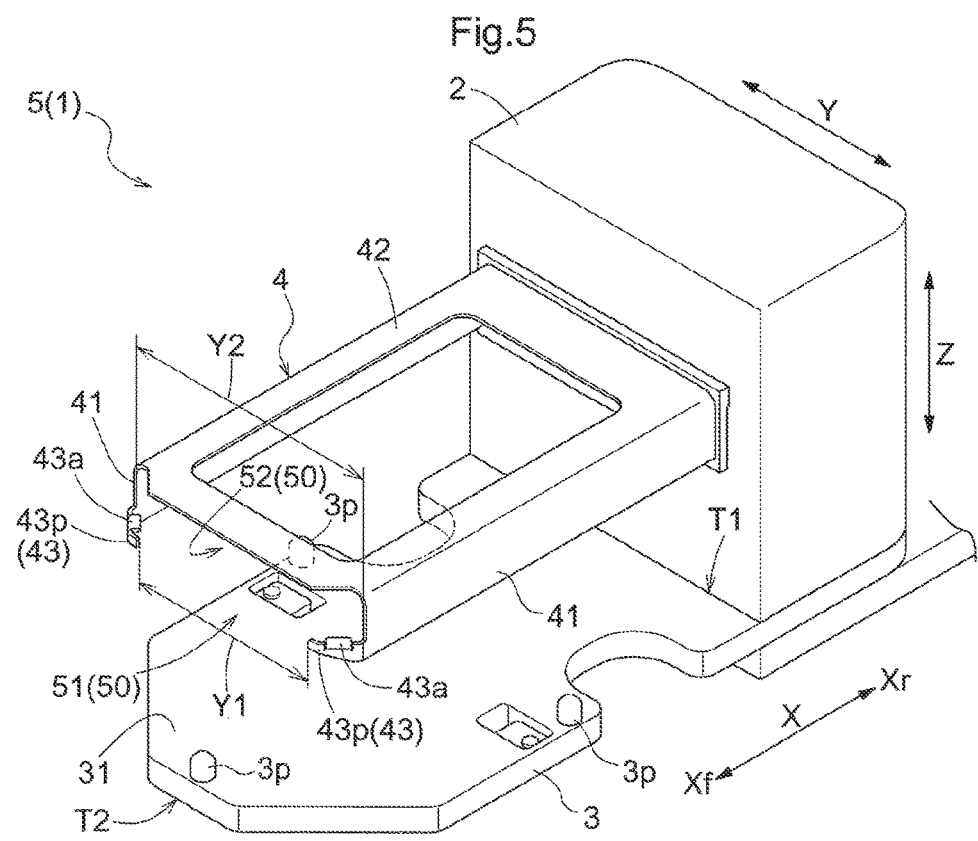
FIG. 5 is a perspective view schematically showing a fork.

FIG. 5 is a schematic perspective view of the fork 5 (article support member). The fork 5 includes a base member 2, a receiving member 3, and a restricting member 4. The receiving member 3 is fixed to the base member 2 in a so-called cantilever fashion with its one end (Xr) along a first direction X along a horizontal plane being a fixed end T1 and with the other end (Xf) along the first direction X being an unsupported end T2. The fork 5 receives and supports a container W on this receiving member 3. As described above, the stacker crane 1 transports a container W with the container W moved at least along the vertical direction along the mast 13 arranged vertically, and with the container W supported by the fork 5.

Figure 6:
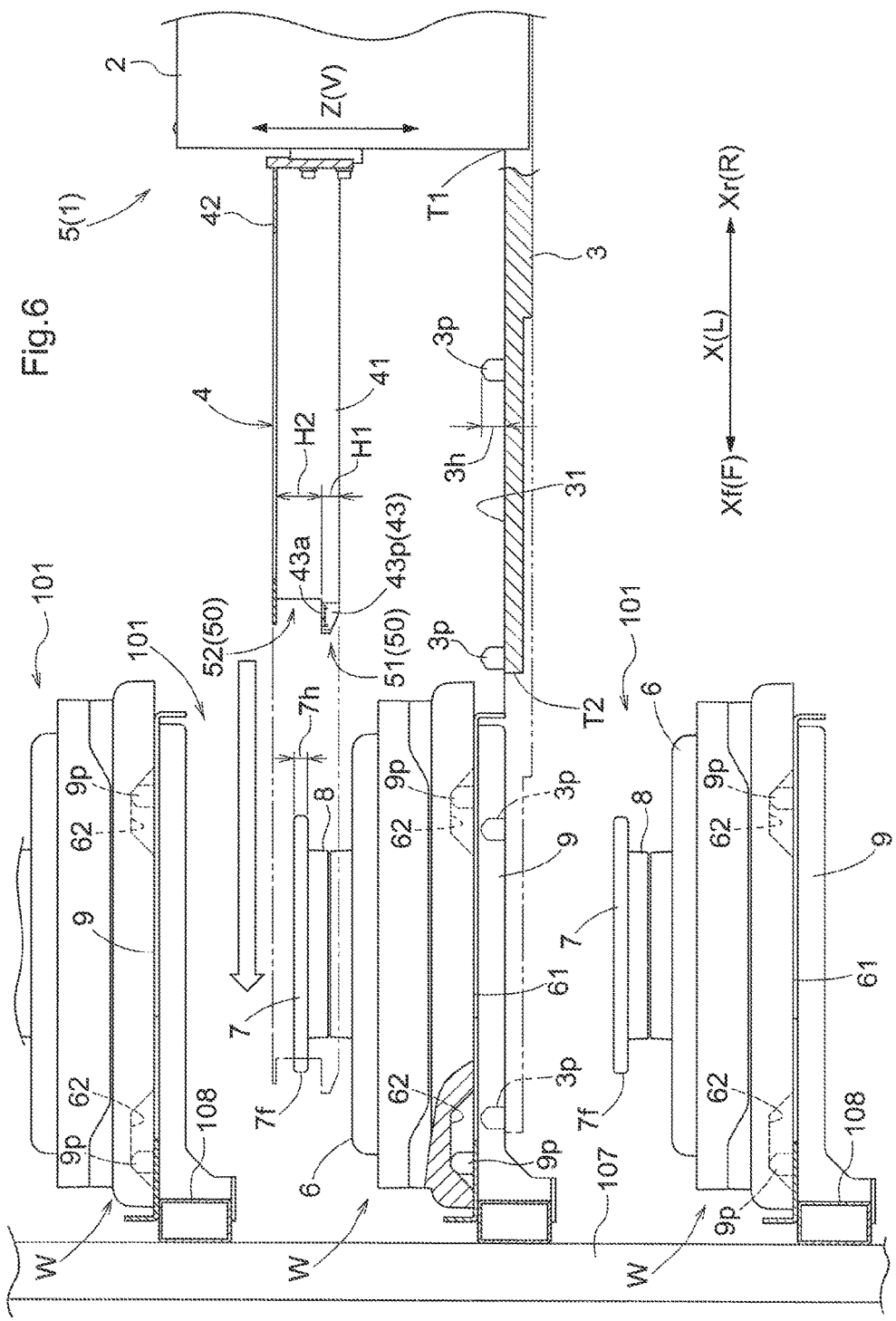
FIG. 6 is a vertical sectional side view showing a relationship between the fork and a container when the fork receives the container.
Figure 7:
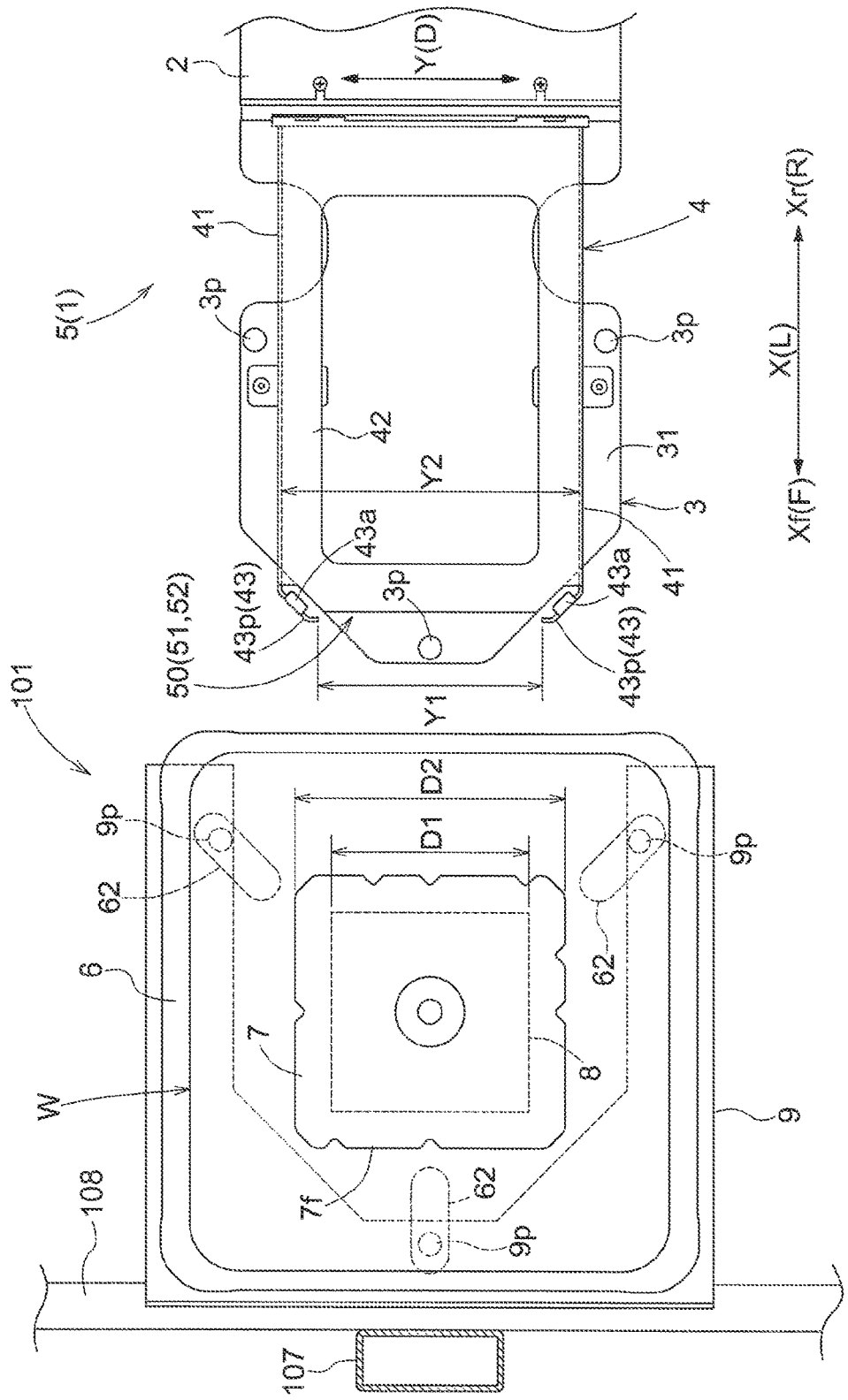
FIG. 7 is a top view showing a relationship between the fork and a container when the fork receives the container.
Figure 8:
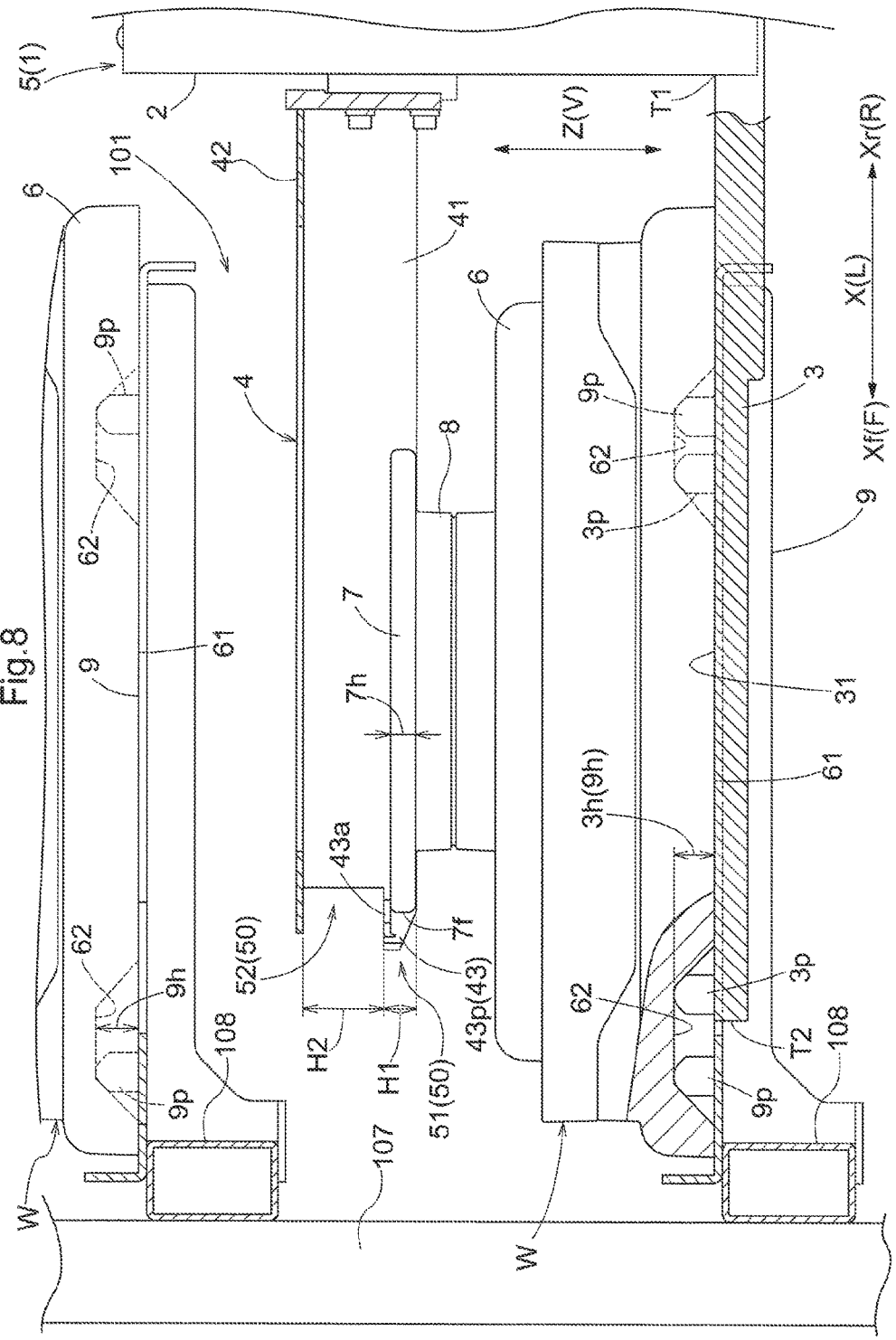
FIG. 8 is a top view showing a relationship between the fork and a container when the container is placed on the fork.
Figure 9:
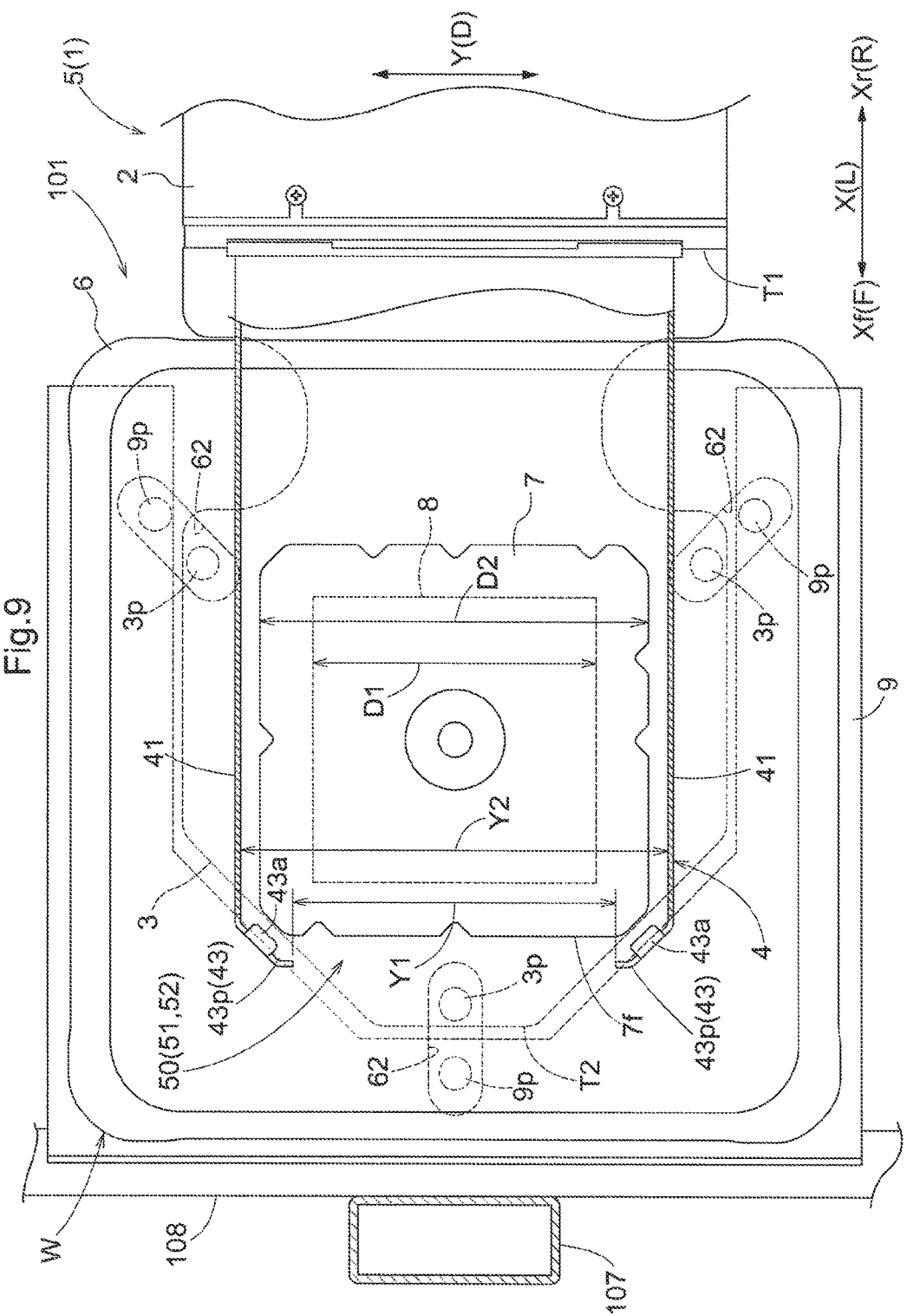
FIG. 9 is a side sectional view showing a relationship between the fork and a container when the container is placed on the fork.

Here, a direction that is parallel to the horizontal place and that is perpendicular to the first direction X will be referred to as a second direction Y (see FIGS. 5, 7, and 9, etc.). In addition, a direction, along the first direction X, of the container W in a supported state (which is the state of the container W in which the container W is supported by the receiving member 3) will be referred to as a front and back direction L of the container W whereas a direction, along the second direction Y, of the container W in a supported state will be referred to as a lateral width direction D of the container W (see FIGS. 2, 3, 6, 7, 8, and 9 etc.). In addition, the unsupported or free end T2 side of a container W in a supported state is defined to be the front direction F side of the container W along the front and back direction L (so that the front direction F is parallel to the first and back direction L and points to the left in FIG. 8, for example). And the fixed end T1 side of a container W in a supported state is defined to be the back direction R side of the container W along the front and back direction L (so that the back direction R is parallel to the first and back direction L and points to the right in FIG. 8, for example). And a direction, that is parallel to the vertical direction Z, of the container W in a supported state is the up and down direction V of the container W (see FIGS. 2, 3, 6, 7, 8, and 9 etc.).

As shown in FIGS. 2 and 3, each container W has the plate-shaped flange portion 7 which extends in parallel to the horizontal plane, in its the upper portion, or on the upper side, along the up and down direction V. As shown in FIG. 5, in addition to the receiving member 3, the fork 5 has a restricting member 4 configured to restrict the container W received and supported by the receiving member 3 from moving at least in the front direction F (unsupported end T2 side (Xf)) by distances greater than a movement distance specified in advance. As described in detail below, the restricting member 4 has portions (front restricting portions 43 described below) which are located across from, and face, at least a portion of a front side surface 7*f* of the flange portion 7 when the container W is received and supported by the receiving member 3 (see FIG. 8, etc.). As shown in FIG. 5, two front restricting portions 43 are formed to form a gap between the two front restricting portions 43 along the second direction Y. In other words, the restricting member 4 is provided with a pair of front restricting portions 43*p* so located as to be spaced apart from each other to form a gap therebetween, along the second direction Y. In addition, as shown in FIG. 5, the restricting member 4 is also fixed to the base member 2 so that the restricting member 4 and the receiving member 3 form an integral structure and are fixedly connected to each other indirectly through the base member 2. Note that the fixing and the fixedly connecting may be accomplished by any known method such as a use of bolts, or welding.

Referring now to FIG. 2, as described above, each container W has a flange support member 8 which is located below the flange portion 7 along the vertical direction to fixedly support the flange portion 7. In addition, as shown in FIG. 3, a support member width D1 which is the dimension of the flange support member 8 along the lateral width direction D is less than a flange width D2 which is the dimension of the flange portion 7 along the lateral width direction D. As shown in FIG. 5, the gap (first opening width Y1 described below) between the pair of front restricting portions 43*p* along the second direction Y is set or formed to have a dimension greater than the support member width D1.

In addition, the restricting member 4 has a peripheral wall portion 41 that at least partially surrounds side surfaces of the flange portion 7 (see FIGS. 5, 6, and 8) when a container W is received and supported by the receiving member 3. As shown in FIGS. 5 and 8, the peripheral wall portion 41 has a peripheral wall opening 50 in a location across from the front side surface 7*f* of the flange portion 7 when a container W is in the supported state. The pair of front restricting portions 43*p* are formed in the peripheral wall portion 41 such that the front restricting portions 43*p* are located horizontally across from, and face, at least a portion of the front side surface 7*f* of a container W in the supported state along the first direction X, and such that one of the pair of restricting portions 43*p* is located horizontally across the peripheral wall opening 50 from the other of the pair of restricting portions 43*p* along the second direction Y. Note that "a front side surface of the flange portion" is defined to be a surface (of the flange portion) whose normal vector has a positive component in the front direction F in case the flange portion has only one such surface, and is defined to be a collection of surfaces (of the flange portion) each of whose normal vector has a positive component in the front direction F in case the flange portion has more than one such surface regardless of presence of any edges between such surfaces. In addition, the restricting member 4 has an eave portion 42 which bends to extend horizontally from upper end portions of the peripheral wall portion 41.

The strength of the restricting member 4 can be increased by having such a peripheral wall portion 41. Therefore, when a container W is displaced out of position, for example, so that the movement of the container W is restricted by the restricting member 4, the restricting member 4 can provide sufficient resisting force against the stress. In addition, the peripheral wall portion 41 can also restrict displacement of the container W out of position along the lateral width direction D, in addition to the restriction of movement of the container W in the front direction F by the pair of front restricting portions 43p. In addition, upward movement of the container W along the up and down direction V can also be restricted by providing the eave portion 42, in addition to the restriction of movement of the container W in the front direction F by the pair of front restricting portions 43p, and the restriction of displacement of the container W out of position along the lateral width direction D by the peripheral wall portion 41. In addition, because the peripheral wall portion 41 has the eave portion 42 that bends from end portions of the peripheral wall portion 41, the restricting member 4 can provide high degree of resistance against bending stress along the second direction Y and the vertical direction Z, which increase the rigidity of the restricting member 4.

As shown in FIG. 5, the pair of front restricting portions 43p are provided in lower portions of the peripheral wall portion 41. In addition, the peripheral wall opening 50 includes a first opening 51 and a second opening 52. The width of the first opening 51 along the second direction Y is a first opening width Y1 which is limited, or narrowed, by the pair of front restricting portions 43p. The second opening 52 is located upward of the first opening 51, and its width along the second direction Y is a second opening width Y2 which is not limited, or narrowed, by the pair of front restricting portions 43p. The second opening 52 is formed such that the second opening width Y2 is greater than the flange width D2, and such that a dimension of the opening along the vertical direction Z (second opening height H2: see FIGS. 6 and 8, etc.) is greater than the thickness (flange thickness 7h: see FIGS. 2, 6, and 8, etc.) of the flange portion 7 along the up and down direction V. Note that the height, or the vertical dimension, of the first opening 51 along the vertical direction Z is a first opening height H1 (see FIGS. 6 and 8, etc.).

Each front restricting portion 43p of the pair is formed by bending, inwardly along the second direction Y, the corresponding end surface of the peripheral wall portion 41 forming the peripheral wall opening 50. Each corner of the flange portion 7 is beveled so that there are two bends in each corner as seen along a vertical direction. The pair of front restricting portions 43p are formed so as to extend in parallel to the respective side end surfaces of the flange portion 7. In other words, the peripheral wall portion 41 extends along the first direction X to a point and then bends twice each time by approximately 45 degrees to extend parallel to the second direction Y. Thus, by forming the pair of front restricting portions 43p such that, when the container W is supported in such a normal attitude, the horizontal distance between each side end surface of the flange portion 7 and the corresponding one of the front restricting portions 43p of the pair stays approximately constant, the movement of the container W can be properly restricted equally regardless of the horizontal direction in which the container W is displaced. To in addition, each of the front restricting portions 43p of the pair has a small eave portion 43a that bends to extend horizontally from an upper end portion of the front restricting portion 43p (see FIGS. 5, 7, 9, and 10, etc.). This small eave portion 34a can prevent the container W from leaping upward in the vertical direction Z as well.

Referring now to FIGS. 6 through 9, an operation to pick up a container W from the shelf board 9 of a storage section 101 by means of the fork 5 is described next. As shown in FIG. 6, the fork 5 is positioned straight across from the container W from the back direction R side along the front and back direction L. At this time, the fork 5 is positioned straight across from the container W such that the top surface 31 of the receiving member 3 is at a lower height along the vertical direction Z than the shelf board 9 by a lower set distance. This lower set distance is greater than the height (fork pin height 3h) of the fork-side positioning pins 3p. In other words, the lower set distance is set such that the bottom surface 61 of the container W and the fork-side positioning pins 3p do not come into contact with each other when the fork 5 is moved in the direction of the shelf board 9 (Xf) along the first direction X. In addition, the lower set distance is also greater than the opening height (first opening height H1) of the first opening 51 and the thickness (flange thickness 7h) of the flange portion 7, along the vertical direction Z. In other words, the lower set distance is also set such that the first opening 51 and the flange portion 7 do not overlap each other as seen along a direction along the first direction X, so that the front restricting portions 43 and the flange portion 7 do not come into contact with each other when the fork 5 is moved in the direction of the shelf board 9 (Xf) along the first direction X.

The fork 5 positioned straight across from the container W received and supported on the shelf board 9 is then projected in the direction of the container W (Xf) along the first direction X. As described above, since the fork 5 is positioned straight across from the container W such that the top surface 31 of the receiving member 3 is at a lower height along the vertical direction Z than the shelf board 9 by the lower set distance, the fork-side positioning pins 3p can pass below the bottom surface 61 of the container W. In addition, the first opening 51 is located at a lower position along the vertical direction Z with respect to the flange portion 7 of the container W and is located horizontally across from the flange support member 8. Therefore, the flange portion 7 is located horizontally across from the second opening 52. As shown in FIGS. 7 and 9, the first opening width Y1 of the first opening 51 is greater than the support member width D1 of the flange support member 8 (Y1>D1) while the second opening width Y2 of the second opening 52 is greater than the flange width D2 of the flange portion 7 (Y2>D2). Therefore, the fork 5 can be projected in the direction of the container W (Xf) along the first direction X without the container W coming into contact with the restricting member 4.

Incidentally, as clearly seen from FIG. 6, the flange portion 7 must be facing, and must be located horizontally across from, the second opening 52 when the fork 5 is positioned straight across from the container W with the receiving member 3 of the fork 5 located at a lower height than the shelf board 9 by the lower set distance. Therefore, it is preferable that the height or the vertical dimension (second opening height H2) of the second opening 52 is set depending on the lower set distance. For example, taking variations in the stop position of the fork 5, etc., into consideration, it would be preferable that the second opening height H2 of the second opening 52 is set to be a value that is two to four times greater than the greatest of the fork pin height 3h, the first opening height H1, and flange thickness 7h.

The fork 5 is raised in the vertical direction after it is projected to cause the top surface 31 of the receiving member 3 to come into contact with the bottom surface 61 of the container W and thus to cause the container W to be received and supported by the receiving member 3. FIGS. 8 and 9 show an example of a situation in which the weight of the container W is applied to, and supported by, both the shelf board 9 and the fork 5. As shown in FIG. 8, the bottom surface recessed portions 62 of the container W are formed to have such dimensions and a shape that both the shelf-board-side positioning pins 9p and the fork-side positioning pins 3p can simultaneously engage the bottom surface recessed portions 62. The pin height "3h" of the fork-side positioning pins 3p is almost the same as the pin height "9h" of the shelf-board-side positioning pins 9p. In addition, each bottom surface recessed portion 62 is formed in a shape that tapers toward its top. And the inner surface of each bottom surface recessed portion 62 includes a sloped surface. Therefore, the fork-side positioning pins 3p are guided by the inner surfaces of the bottom surface recessed portions 62 even if the position of the fork 5 and the position of the container W are displaced from each other horizontally, allowing the container W to be received and supported by the fork 5 in a proper position.

When the fork 5 is raised further from its position shown in FIG. 8, the container W is lifted and moved away from the shelf board 9, and is thus picked up by the fork 5 (which position is not shown). The distance by which the fork 5 is raised in this process is also specified in advance as an upper set distance. The upper set distance is preferably set depending the vertical (Z) distance between the storage sections 101 so as to have a value within such a range that the container W and the fork 5 do not come into contact with the shelf board 9 located above them. After the fork 5 has picked up the container W, the fork 5 is retracted toward the mast 13. The stacker crane 1 transports the container W to a transport destination, and unloads the container W by performing the aforementioned process in reverse order. Since a person skilled in the art can readily understand the unloading procedure, detailed description of the procedure is omitted here.

As shown in FIGS. 8 and 9, in a supported state which is the state of the container W in which the container W is supported by the receiving member 3, at least a portion of the front side surface 7f of the flange portion 7 and the pair of front restricting portions 43p of the restricting member 4 are located across from each other and face each other, and overlap each other as seen along the first direction. Therefore, even if a sudden jolt, etc., occurs in the fork 5 with a container W in a supported state, the container W is restricted from moving at least in the front direction F by distances greater than a movement distance specified in advance. This movement distance is preferably greater than the amount of movement of the container W caused by a wobbling or rocking motion that may occur, for example, during a normal transporting process, and is preferably less than the amount of movement that causes disengagement between the fork-side positioning pins 3p and the bottom surface recessed portions 62. For example, the movement distance within which the movement is restricted may be set to be greater than, or equal to, the radius of the fork-side positioning pins 3p and less than one half of the length of a bottom surface recessed portion 62 in the bottom surface 61 along the front and back direction L.

Figure 10:
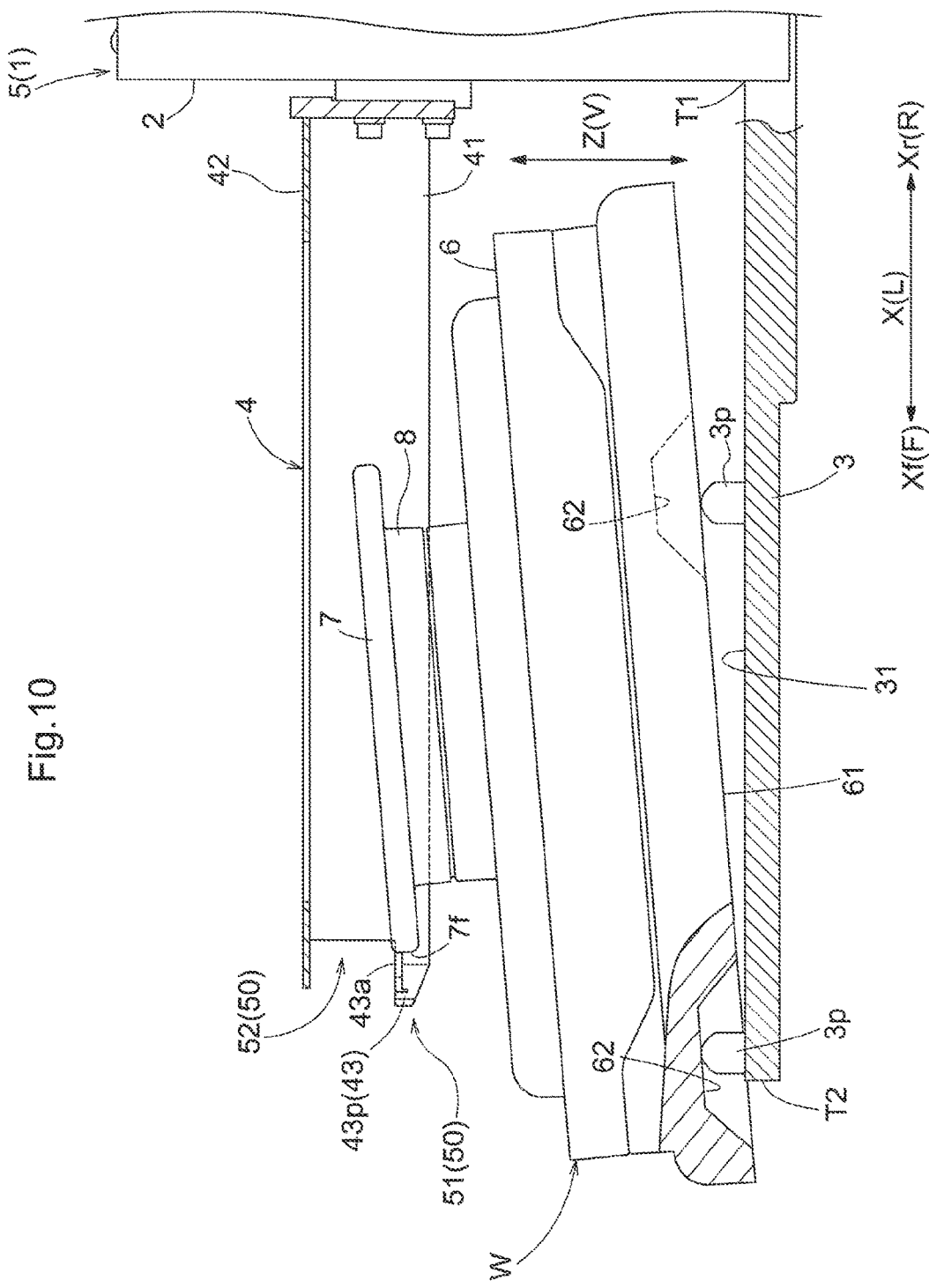
FIG. 10 is a vertical sectional view schematically showing an example in which movement of the container is restricted.

FIG. 10 shows an example of a situation in which, with a container W received and supported by the fork 5, a sudden jolt, etc., occurs due to a sudden stop, causing the container W to be jolted on the receiving member 3, and causing the back direction R side of the container W to be lifted and the container W to be tilted forward (F). As shown in FIG. 10, even when the container W is tilted forward, the movement of the container W in the front direction F is restricted by the pair of front restricting portions 43p. The small eave portions 43a that bend to extend horizontally from upper end portions of the front restricting portions 43p also prevents the flange portion 7 from jumping toward the second opening 52. Therefore, even when a sudden jolt occurs in the fork 5, the container W is prevented from falling out of the fork 5. In addition, in the present embodiment, the restricting member 4 includes the eave portion 42; so, even if the entire container W jumps up along the vertical direction Z, the movement of the container W is restricted by the bottom surface of the eave portion 42 coming into contact with the top surface of the flange portion 7.

Incidentally, the center of gravity of such a container W is not always located in the middle position of the container W in the direction along the first direction X, and is often displaced from the middle position. In other words, the center of gravity is often displaced in the front direction F or back direction R from the middle position. In such cases, when the fork 5 is suddenly jolted, the container W is likely to wobble. However, the movement of the container W is restricted by the presence of the restricting member 4 as in the present embodiment, properly preventing the container W from, for example, falling out of the fork 5.

Other Embodiments

Other embodiments are described next. Note that any arrangement and feature of each embodiment described below does not have to be used or incorporated by itself but may be combined with any arrangement and feature of any other embodiment as long as such combination does not give rise to a contradiction. Regarding any other arrangements and features, the embodiments disclosed in the present description are provided for the purposes of illustration only regarding all aspects. Therefore, it is possible to make various suitable changes without departing from the spirit of the present disclosure.

(1) In the description above, an example is described in which, as shown in FIG. 3, each container W has a container main body 6 whose dimension along the lateral width direction D is greater than the flange width D2, and a flange support member 8 which is located between the container main body 6 and the flange portion 7 and whose dimension along the lateral width direction D is less than the flange width D2. In other words, an example is described in which a container W has a shape of an "H" lying on its side as seen along the front and back direction L. However, the container W may have such a shape that the dimension of the container main body 6 along the lateral width direction D may be less than the flange width D2, for example. In other words, the container W may have a shape of a letter "T" as seen along the front and back direction L. That is, it is sufficient for a container W to have a portion (below the flange portion 7) whose dimension along the lateral width direction D is less than the flange width D2 as seen along the front and back direction L.

(2) In the description above, an example is described in which each container W to be transported by the article transport device is a reticle pod. However, the container W may be a FOUP (Front Opening Unified Pod) for storing a plurality of semiconductor wafers. Note that, naturally, the articles to be transported are not limited to containers for holding one or more items.

(3) In the description above, an example is described in which the restricting member 4 has the peripheral wall portion 41, and in which the pair of front restricting portions 43p are formed to extend from the peripheral wall portion 41. However, only a pair of front restricting portions 43p may be provided without such a peripheral wall portion 41. For example, the pair of front restricting portions 43p may be provided at distal ends of frame members fixed to the base member 2.

(4) In the description above, an example is described in which a stacker crane 1 is an article transport device. However, an article transport device may be a transport device of other mechanism so long as the device can support an article and can vertically transport the article.

Summary of Embodiments

The article transport device described above is briefly summarized next.

In one embodiment, an article transport device in light of the above comprises: an article support member configured to receive and support an article on a plate-shaped receiving member whose one end along a first direction parallel to a horizontal plane is a fixed end, and whose opposite end along the first direction is an unsupported end, wherein the article transport device is configured to transport the article at least in a vertical direction with the article in a supported state which is a state of the article in which the article is supported by the article support member, wherein, with a second direction being a direction that is parallel to the horizontal plane and that is perpendicular to the first direction, a front and back direction of the article being a direction, of the article in the supported state, that is parallel to the first direction, a lateral width direction of the article being a direction, of the article in the supported state, that is parallel to the second direction, a front direction side of the article along the front and back direction being an unsupported end side of the article in the supported state along the front and back direction, a back direction side of the article along the front and back direction being a fixed-end side of the article in the supported state along the front and back direction, and an up and down direction of the article being a direction, of the article in the supported state, that is parallel to the vertical direction, the article has a plate-shaped flange portion, which extends parallel to the horizontal plane, in an upper portion of the article with respect to the up and down direction, wherein the article support member further includes a restricting member which is positioned such that at least a portion of the restricting member is located across from at least a portion of a front side surface of the flange portion when the article is in the supported state, and which is configured to restrict the article in the supported state from moving at least in the front direction by distances greater than a movement distance specified in advance, wherein the restricting member includes a pair of front restricting portions that are so located to be spaced apart from each other to form a gap therebetween along the second direction, wherein the restricting member and the receiving member are fixedly connected to each other directly or indirectly.

With this arrangement, movement of the article received by (i.e., placed on) the receiving member at least in the front direction is restricted by the pair of front restricting portions. In addition, the fixed end of the receiving member is located on the back side of the article. And a member for fixing the receiving member is often provided on the back side of the article. Thus, movement of the article in the back direction is also restricted by that member. Therefore, by providing the pair of front restricting portions, the article received by, or placed on, the support platform can be prevented from being displaced out of position or from falling off from the unsupported end of the receiving member. In addition, the restricting member having the pair of front restricting portions and the receiving member are fixedly connected to each other directly or indirectly. In other words, the article support member can restrict movement of an article in the front direction without having to move any movable restricting member to a specified position after the article is received by, or placed on, the receiving member. Therefore, the article support member does not require a driving mechanism, or an actuator, etc. for moving any restricting member, preventing the article transport device from becoming more complex or larger in size. As such, with the arrangement describe, with a relatively simple structure, an article received by a receiving member can be prevented from being displaced out of position or from falling out of the receiving member while being transported.

Here, the center of gravity of the article is preferably displaced in one of the front direction and the back direction with respect to a middle position of the article along a direction parallel to the first direction.

When the center of gravity of the article being transported by the article transport device is offset or displaced along the front and back direction of the article with respect to the geometric center (center of gravity) in plan view which is a view of the article as seen along the up and down direction, the article received by or placed on the receiving member tends to tilt in the front or back direction when an external force, such as a sudden jolt, acts on the article support member. Although the article could have otherwise fallen from the unsupported end side of the receiving member when the article tilts in the front direction, the article is prevented from falling because its movement in the front direction is restricted by the pair of front restricting portions.

Also, in one embodiment, the article preferably has a flange support member which is located below the flange portion along the up and down direction, and which fixedly supports the flange portion, wherein a support member width which is a dimension of the flange support member along the lateral width direction is preferably less than a flange width which is a dimension of the flange portion along the lateral width direction, and wherein the gap between the front restricting portions of the pair along the second direction is preferably formed to have a dimension greater than the support member width.

Because the support member width is less than the dimension of the gap between the pair of front restricting portions along the second direction, the flange support member can pass through the gap between the pair of front restricting portions when loading an article onto, and unloading an article from, the receiving member. In other words, with the arrangement described above, an article can be smoothly loaded and unloaded by the article support member.

In addition, in one embodiment, the restricting member preferably includes a peripheral wall portion arranged to at least partially surround side surfaces of the flange portion when the article is in the supported state, wherein the peripheral wall portion preferably has a peripheral wall opening in a location across from the front side surface, and wherein the pair of front restricting portions are preferably formed in the peripheral wall portion such that each of the front restricting portions of the pair is located across from at least a portion of the front side surface along the first direction, and such that one of the restricting portions of the pair is located across the peripheral wall opening from the other of the restricting portions of the pair along the second direction.

The strength of the restricting member can be increased by having such a peripheral wall portion. And when the article is displaced out of position, for example, so that the movement of the article is restricted by the restricting member, the restricting member can provide sufficient resisting force against the stress. In addition, the peripheral wall portion can also restrict displacement of the article out of position along the lateral width direction, in addition to the restriction of movement of the article in the front direction by the pair of front restricting portions. Also, in addition to the fact that the rigidity of the restricting member is increased and the number of directions in which displacement is restricted is increased by the arrangement described above, an article can be loaded and unloaded by the article support member without hindrance because the peripheral wall opening is formed.

In addition, in one embodiment, the restricting member preferably includes an eave portion which bends to extend horizontally from upper end portions of the peripheral wall portion.

Upward movement of the article along the up and down direction can also be restricted by providing the eave portion, in addition to the restriction of movement of the article in the front direction by the pair of front restricting portions, and the restriction of the displacement of the article out of position along the lateral width direction by the peripheral wall portion. Also, because the peripheral wall portion includes the eave portion which bends to extend horizontally from upper end portions of the peripheral wall portion, the resistance of the restricting member against bending force along the second direction and the vertical direction is increased, thus increasing the rigidity of the restricting member.

In addition, in one embodiment, the pair of front restricting portions are preferably provided in lower portions of the peripheral wall portion, wherein the peripheral wall opening preferably includes a first opening whose width along the second direction is a first opening width which is limited by the pair of front restricting portions, and a second opening which is located above the first opening, whose width along the second direction is a second opening width which is not limited by the pair of front restricting portions, and wherein the second opening is preferably formed such that the second opening width is greater than a flange width which is a dimension of the flange portion along the lateral width direction, and such that an opening height of the second opening along the vertical direction is greater than a thickness of the flange portion along the up and down direction.

An article can be picked up, for example, by moving the article support member along the first direction and toward the article, with the peripheral wall opening located across from an article, to place the receiving member under the article, and by subsequently raising the article support member along the vertical direction. During this operation, the flange portion can move through the second opening without hindrance since the second opening width of the second opening of the peripheral wall opening is greater than the flange width. When that happens, the flange support member, which has the support member width which is less than the flange width, moves through the first opening whose width is less than the dimension of the second opening. Thus, the entire flange and its support member are allowed to pass through the peripheral wall opening, and the entire article is lead to a location above the receiving member. Here, when the article support member is raised, and the receiving member and the bottom surface of the article come into contact with each other, and the article is received by, i.e., placed on the receiving member, at least a portion of the front direction side of the flange portion, i.e., at least a portion of the front side surface of the flange portion is located across from the pair of front restricting portions. Thus, movement of the article in the front direction is restricted. In other words, with the arrangement described above, there is no need to provide any movable restricting member, to retrieve such restricting member out of position before placing an article on the receiving member, or to move such restricting member back to position after the article is placed on the receiving member. Therefore, the article support member does not require a driving mechanism, or an actuator, etc. for moving any restricting member, preventing the article transport device from becoming more complex or larger in size. As such, with the arrangement describe, with a relatively simple structure, an article received by a receiving member can be prevented from being displaced out of position or from falling out of the receiving member while being transported.

What is claimed is:

1. An article transport device comprising:
an article support member configured to receive and support an article on a plate-shaped receiving member whose one end along a first direction parallel to a horizontal plane is a fixed end, and whose opposite end along the first direction is an unsupported end,
wherein the article transport device is configured to transport the article at least in a vertical direction with the article in a supported state which is a state of the article in which the article is supported by the article support member,
wherein, with a second direction being a direction that is parallel to the horizontal plane and that is perpendicular to the first direction, a front and back direction of the article being a direction, of the article in the supported state, that is parallel to the first direction, a lateral width direction of the article being a direction, of the article in the supported state, that is parallel to the second direction, a front direction side of the article along the front and back direction being an unsupported end side of the article in the supported state along the front and back direction, a back direction side of the article along the front and back direction being a fixed-end side of the article in the supported state along the front and back direction, and an up and down direction of the article being a direction, of the article in the supported state, that is parallel to the vertical direction,
the article has a plate-shaped flange portion, which extends parallel to the horizontal plane, in an upper portion of the article with respect to the up and down direction,
wherein the article support member further includes a restricting member which is positioned such that at least a portion of the restricting member is located across from at least a portion of a front side surface of the flange portion when the article is in the supported state, and which is configured to restrict the article in the supported state from moving at least in the front direction by distances greater than a movement distance specified in advance, wherein the restricting member includes a pair of front restricting portions that are so located to be spaced apart from each other to form a gap therebetween along the second direction, wherein the restricting member and the receiving member are fixedly connected to each other directly or indirectly, such that such that the restricting member is immovable relative to the receiving member.

2. The article transport device as defined in claim 1, wherein the article has a flange support member which is located below the flange portion along the up and down direction, and which fixedly supports the flange portion, wherein a support member width which is a dimension of the flange support member along the lateral width direction is less than a flange width which is a dimension of the flange portion along the lateral width direction, and wherein the gap between the front restricting portions of the pair along the second direction is formed to have a dimension greater than the support member width.

3. The article transport device as defined in claim 1, wherein the restricting member includes a peripheral wall portion arranged to at least partially surround side surfaces of the flange portion when the article is in the supported state, wherein the peripheral wall portion has a peripheral wall opening in a location across from the front side surface, and wherein the pair of front restricting portions are formed in the peripheral wall portion such that each of the front restricting portions of the pair is located across from at least a portion of the front side surface along the first direction, and such that one of the restricting portions of the pair is located across the peripheral wall opening from the other of the restricting portions of the pair along the second direction.

4. The article transport device as defined in claim 2, wherein the restricting member includes a peripheral wall portion arranged to at least partially surround side surfaces of the flange portion when the article is in the supported state, wherein the peripheral wall portion has a peripheral wall opening in a location across from the front side surface, and wherein the pair of front restricting portions are formed in the peripheral wall portion such that each of the front restricting portions of the pair is located across from at least a portion of the front side surface along the first direction, and such that one of the restricting portions of the pair is located across the peripheral wall opening from the other of the restricting portions of the pair along the second direction.

5. The article transport device as defined in claim 3, wherein the restricting member includes an eave portion which bends to extend horizontally from upper end portions of the peripheral wall portion.

6. The article transport device as defined in claim 4, wherein the restricting member includes an eave portion which bends to extend horizontally from upper end portions of the peripheral wall portion.

7. The article transport device as defined in claim 5, wherein the pair of front restricting portions are provided in lower portions of the peripheral wall portion, wherein the peripheral wall opening includes a first opening whose width along the second direction is a first opening width which is limited by the pair of front restricting portions, and a second opening which is located above the first opening, whose width along the second direction is a second opening width which is not limited by the pair of front restricting portions, and wherein the second opening is formed such that the second opening width is greater than a flange width which is a dimension of the flange portion along the lateral width direction, and such that an opening height of the second opening along the vertical direction is greater than a thickness of the flange portion along the up and down direction.

8. The article transport device as defined in claim 6, wherein the pair of front restricting portions are provided in lower portions of the peripheral wall portion, wherein the peripheral wall opening includes a first opening whose width along the second direction is a first opening width which is limited by the pair of front restricting portions, and a second opening which is located above the first opening, whose width along the second direction is a second opening width which is not limited by the pair of front restricting portions, and wherein the second opening is formed such that the second opening width is greater than a flange width which is a dimension of the flange portion along the lateral width direction, and such that an opening height of the second opening along the vertical direction is greater than a thickness of the flange portion along the up and down direction.

9. The article transport device as defined in claim 1, wherein a center of gravity of the article is displaced in one of the front direction and the back direction with respect to a middle position of the article along a direction parallel to the first direction.

10. The article transport device as defined in claim 2, wherein a center of gravity of the article is displaced in one of the front direction and the back direction with respect to a middle position of the article along a direction parallel to the first direction.

11. The article transport device as defined in claim 3, wherein a center of gravity of the article is displaced in one of the front direction and the back direction with respect to a middle position of the article along a direction parallel to the first direction.

12. The article transport device as defined in claim 4, wherein a center of gravity of the article is displaced in one of the front direction and the back direction with respect to a middle position of the article along a direction parallel to the first direction.

13. The article transport device as defined in claim 5, wherein a center of gravity of the article is displaced in one of the front direction and the back direction with respect to a middle position of the article along a direction parallel to the first direction.

14. The article transport device as defined in claim 6, wherein a center of gravity of the article is displaced in one of the front direction and the back direction with respect to a middle position of the article along a direction parallel to the first direction.

15. The article transport device as defined in claim 7, wherein a center of gravity of the article is displaced in one of the front direction and the back direction with respect to a middle position of the article along a direction parallel to the first direction.

16. The article transport device as defined in claim 8, wherein a center of gravity of the article is displaced in one of the front direction and the back direction with respect to a middle position of the article along a direction parallel to the first direction.

* * * * *

UNITED STATES PATENT AND TRADEMARK OFFICE
CERTIFICATE OF CORRECTION

PATENT NO.        : 10,283,394 B2
APPLICATION NO.   : 15/697782
DATED             : May 7, 2019
INVENTOR(S)       : Takeshi Abe et al.

Page 1 of 1

It is certified that error appears in the above-identified patent and that said Letters Patent is hereby corrected as shown below:

In the Claims

Column 15, Line 12, Claim 1, delete "such that such that" and insert -- such that --

Signed and Sealed this
Ninth Day of July, 2019

Andrei Iancu
*Director of the United States Patent and Trademark Office*